US012660622B2

(12) United States Patent
Cho et al.

(10) Patent No.: US 12,660,622 B2
(45) Date of Patent: Jun. 16, 2026

(54) SEMICONDUCTOR PACKAGE INCLUDING HEAT DISSIPATION LAYERS

(71) Applicant: SAMSUNG ELECTRONICS CO., LTD., Suwon-si (KR)

(72) Inventors: Seunghyun Cho, Suwon-si (KR); Jae-Min Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 408 days.

(21) Appl. No.: 18/510,056

(22) Filed: Nov. 15, 2023

(65) Prior Publication Data

US 2024/0162111 A1 May 16, 2024

(30) Foreign Application Priority Data

Nov. 15, 2022 (KR) ........................ 10-2022-0153042
Jul. 18, 2023 (KR) ........................ 10-2023-0092987

(51) Int. Cl.
| | |
|---|---|
| *H10W 40/25* | (2026.01) |
| *H10W 70/60* | (2026.01) |
| *H10W 70/67* | (2026.01) |
| *H10W 70/685* | (2026.01) |
| *H10W 72/00* | (2026.01) |
| *H10W 72/20* | (2026.01) |
| *H10W 90/00* | (2026.01) |

(52) U.S. Cl.
CPC ........ *H10W 40/251* (2026.01); *H10W 70/611* (2026.01); *H10W 70/685* (2026.01); *H10W 70/688* (2026.01); *H10W 90/00* (2026.01);

*H10W 72/248* (2026.01); *H10W 72/856* (2026.01); *H10W 90/724* (2026.01); *H10W 90/734* (2026.01)

(58) Field of Classification Search
CPC ............. H10W 40/251; H10W 70/611; H10W 70/685; H10W 70/688; H10W 90/00; H10W 72/248; H10W 72/856; H10W 90/724; H10W 90/734; H10W 72/851; H10W 40/10
See application file for complete search history.

(56) References Cited

U.S. PATENT DOCUMENTS

| | | | |
|---|---|---|---|
| 9,997,448 B1 * | 6/2018 | Sato | .................... H10W 70/095 |
| 11,147,160 B2 | 10/2021 | Lee et al. | |
| 11,682,633 B2 | 6/2023 | Park et al. | |

(Continued)

FOREIGN PATENT DOCUMENTS

| | | |
|---|---|---|
| JP | 7002643 B2 | 1/2022 |
| KR | 10-2015-0104243 A | 9/2015 |

(Continued)

*Primary Examiner* — Douglas W Owens
(74) *Attorney, Agent, or Firm* — Sughrue Mion, PLLC

(57) ABSTRACT

A semiconductor package includes a flexible insulating substrate including a first surface and a second surface opposite to the first surface, a first wiring on the first surface of the flexible insulating substrate, a second wiring on the second surface of the flexible insulating substrate, a plurality of vias coupling the first wiring to the second wiring, a plurality of semiconductor devices on the first surface of the flexible insulating substrate, and a heat dissipation resin layer at least partially covering at least one semiconductor device of the plurality of semiconductor devices.

20 Claims, 11 Drawing Sheets

(56)　　　　　　　References Cited

U.S. PATENT DOCUMENTS

| | | | |
|---|---|---|---|
| 11,728,261 B2 | 8/2023 | Kim | |
| 2015/0303130 A1 | 10/2015 | Kim et al. | |
| 2016/0049356 A1* | 2/2016 | Jung ...................... | H05K 1/189 |
| | | | 257/774 |
| 2018/0046283 A1* | 2/2018 | Yoshida ................ | G06F 3/0446 |
| 2020/0221571 A1 | 7/2020 | Lee et al. | |
| 2022/0013476 A1 | 1/2022 | Park et al. | |
| 2022/0028777 A1 | 1/2022 | Kim | |

FOREIGN PATENT DOCUMENTS

| | | | | |
|---|---|---|---|---|
| KR | 20150140977 A | * 12/2015 | ............ | H01L 23/48 |
| KR | 10-1585756 B1 | 1/2016 | | |
| KR | 10-1670392 B1 | 10/2016 | | |
| KR | 10-1677322 B1 | 11/2016 | | |
| KR | 10-2022-0008105 A | 1/2022 | | |
| KR | 10-2022-0012676 A | 2/2022 | | |

* cited by examiner

Bending Moment = Length Force

Distance in Length Direction ↔ Distance in Width Direction
Neutral Axis

[Neutral Axis and Distances]

Neutral Axis

[Stress Rate]

SEMICONDUCTOR PACKAGE INCLUDING HEAT DISSIPATION LAYERS

CROSS-REFERENCE TO RELATED APPLICATIONS

This application claims benefit of priority under 35 U.S.C. § 119 to Korean Patent Application No. 10-2022-0153042, filed on Nov. 15, 2022, and to Korean Patent Application No. 10-2023-0092987, filed on Jul. 18, 2023, in the Korean Intellectual Property Office, the disclosures of which are incorporated by reference herein in their entireties.

BACKGROUND

1. Field

The present disclosure relates generally to a semiconductor package, and more particularly, to semiconductor packages including heat dissipation layers.

2. Description of the Related Art

Displays such as, but not limited to, organic light emitting displays (OLEDs) and liquid crystal displays (LCDs), may include display panels and/or driver integrated circuits (ICs) that may be disposed on the backs and/or sides of the display panels. For example, the driver ICs may be implemented in the form of semiconductor devices. These semiconductor devices may be coupled to the display panels by packaging technologies such as, but not limited to, chip on film (COF), tape carrier package (TCP), chip on glass (COG), and the like.

While COF semiconductor packages, for example, may be well-suited to such applications due to their flexibility, in the case of high-definition displays, the driving load of the semiconductor devices may increase, and as a result, the semiconductor devices may generate excessive heat, which may cause degraded performance and/or reliability.

In order to potentially address the generation of the excessive heat, proposed approaches suggest mounting a heat dissipation member on the lower surface of a flexible insulating substrate. However, such approaches may not address the excessive heat and/or may not be desirable. For example, the thermal conductivity of the flexible insulating substrate may be relatively low, and consequently, the heat dissipation efficiency may not be sufficient to address the excessive heat. Alternatively or additionally, the heat dissipation member may be in the form of a plate made of a metal (e.g., aluminum), and as such, the heat dissipation member may cause a decrease in the flexibility of a COF-type semiconductor package, and/or the heat dissipation member may become separated from the flexible insulating substrate.

Thus, there exists a need for further improvements in semiconductor package technology, as the need for display panels and/or driver ICs may be constrained by excessive heat generation. Improvements are presented herein. These improvements may also be applicable to other semiconductor package technologies.

SUMMARY

Aspects of the present disclosure may provide a semiconductor package having an improved heat dissipation efficiency when compared to related semiconductor devices.

Aspects of the present disclosure may provide a semiconductor package having an improved usability of input/output terminals when compared to related semiconductor devices.

According to an aspect of the present disclosure, a semiconductor package is provided. The semiconductor package includes a flexible insulating substrate including a first surface and a second surface opposite to the first surface, a first wiring on the first surface of the flexible insulating substrate, a second wiring on the second surface of the flexible insulating substrate, a plurality of vias coupling the first wiring to the second wiring, a plurality of semiconductor devices on the first surface of the flexible insulating substrate, and a heat dissipation resin layer at least partially covering at least one semiconductor device of the plurality of semiconductor devices.

According to an aspect of the present disclosure, a semiconductor package is provided. The semiconductor package includes a flexible insulating substrate including a first surface and a second surface opposite to the first surface, a first wiring on the first surface of the flexible insulating substrate, a second wiring on the second surface of the flexible insulating substrate, a plurality of vias coupling the first wiring to the second wiring, a plurality of semiconductor devices on the first surface of the flexible insulating substrate, a plurality of solder bumps disposed between the plurality of semiconductor devices and the first wiring, a first solder resist at least partially covering at least a first portion of the first wiring, a second solder resist at least partially covering at least a second portion of the second wiring, and a heat dissipation resin layer at least partially covering the plurality of semiconductor devices. The plurality of solder bumps includes short-side-part solder bumps disposed along short sides of the plurality of semiconductor devices, and long-side-part solder bumps disposed along long sides of the plurality of semiconductor devices. The short-side-part solder bumps are coupled to the second wiring using respective vias from among the plurality of vias. The respective vias are disposed directly below the short-side-part solder bumps. The heat dissipation resin layer includes a thermally conductive polymer compound including a thermally conductive filler and at least one of an epoxy-based resin and a silicon-based thermosetting polymer.

According to an aspect of the present disclosure, a semiconductor package is provided. The semiconductor package includes a flexible insulating substrate including a first surface and a second surface opposite to the first surface, a first wiring on the first surface of the flexible insulating substrate, a second wiring on the second surface of the flexible insulating substrate, a plurality of vias coupling the first wiring to the second wiring, a plurality of semiconductor devices on the first surface of the flexible insulating substrate, a plurality of solder bumps disposed between the plurality of semiconductor devices and the first wiring, a first solder resist at least partially covering at least a first portion of the first wiring, a second solder resist at least partially covering at least a second portion of the second wiring, a heat dissipation resin layer at least partially covering at least one semiconductor devices of the plurality of semiconductor devices, and a metal tape at least partially covering remaining semiconductor devices of the plurality of semiconductor devices. The plurality of solder bumps includes short-side-part solder bumps disposed along short sides of the plurality of semiconductor devices, and long-side-part solder bumps disposed along long sides of the plurality of semiconductor devices. The short-side-part solder bumps are coupled to the second wiring using respective vias from among the plurality of vias. The respective vias being disposed directly below the short-side-part solder bumps. The heat dissipation resin layer includes a thermally conductive polymer compound including a thermally conductive filler and at least one of an epoxy-based resin and a silicon-based thermosetting polymer.

In an embodiment, the semiconductor device may be covered with a heat dissipation resin having high thermal conductivity, such that the semiconductor device may be fixed and protected. Therefore, heat generated by the semiconductor device may be efficiently released from the semiconductor device.

In an embodiment, short-side-part input/output terminals of a semiconductor device may be utilized to improve the degree of freedom of wiring arrangement and may contribute to package miniaturization.

Additional aspects may be set forth in part in the description which follows and, in part, may be apparent from the description, and/or may be learned by practice of the presented embodiments.

BRIEF DESCRIPTION OF THE DRAWINGS

The above and other aspects, features, and advantages of certain embodiments of the present disclosure may be more apparent from the following description taken in conjunction with the accompanying drawings, in which.

DETAILED DESCRIPTION

Figure 1:
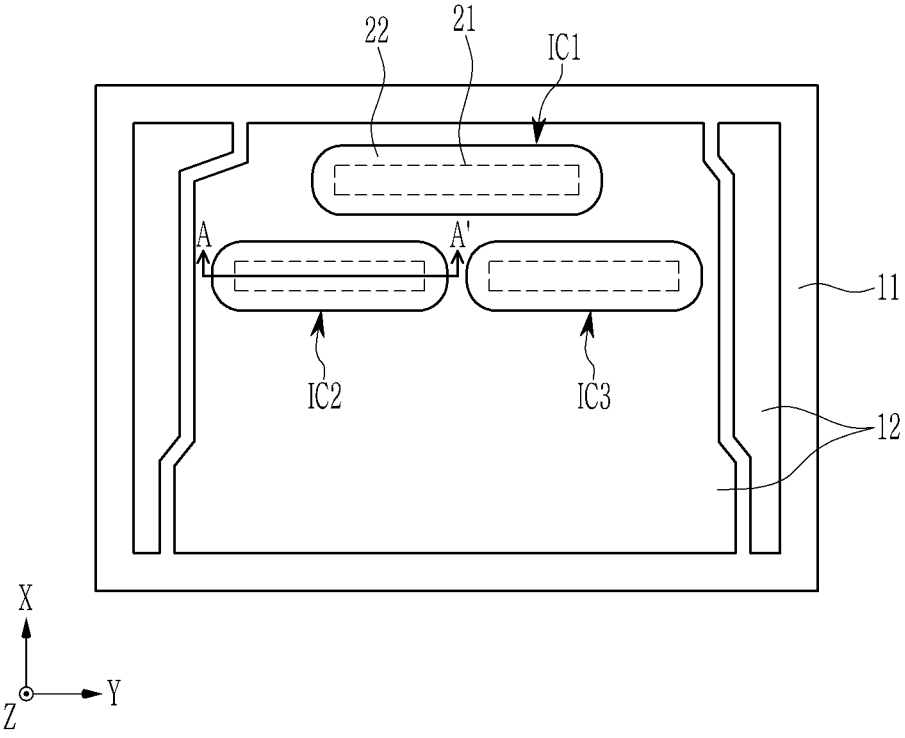
FIG. 1 is a top view of a semiconductor package, according to an embodiment.

Embodiments are described hereinafter with reference to the accompanying drawings. As those skilled in the art may understand, the described embodiments may be modified in various different ways, without departing from the spirit and/or scope of the described embodiments.

The drawings and description may be regarded as illustrative in nature, and not as restrictive. Throughout this present disclosure, identical constituent elements may be denoted by the same reference symbol.

In the drawings, the sizes and thicknesses of the individual constituent elements may be randomly indicated for ease of explanation. That is, the present invention may not be necessarily limited to the sizes and/or thicknesses shown in the drawings. For example, in the drawings, the thicknesses of layers, films, panels, regions, and the like, may be exaggerated for clarity. As another example, the thicknesses of some layers and/or areas may be exaggerated for ease of explanation.

Expressions written in the singular forms in the present disclosure may intended to encompass the plural forms unless clear expressions such as "a", "an", or "single" are used.

As used herein, the term "and/or" may be intended to encompass arbitrary combinations of the terms "and" and "or" for its meaning and/or interpretation. For example, "A and/or B" may be understood as meaning "A, B, or A and B".

As used herein, the phrase "at least one of" may be intended to encompass the meaning "at least one selected from a group of" for its meaning and interpretation. For example, "at least one of A and B" may be understood as meaning "A, B, or A and B, or A or B".

The terms "1st", "first", "2nd", "second", and the like, may be used to describe various constituent elements. However, these constituent elements may not be limited by the terms. These terms may only be used to distinguish one element from other elements. For example, a first constituent element may be referred to as a second constituent element, and similarly, a second constituent element may be referred to as a first constituent element, without departing from the scope of the present invention.

When an element such as a layer, a film, a region, a substrate is referred to as being "on" another element, the element may be directly on the other element and/or intervening elements may also be present. In contrast, when an element is referred to as being "directly on" another element, there may be no intervening elements present. Further, it may be appreciated that, throughout the present disclosure, when an element is "on" a target element, the element may be located above or below the target element, and may not necessarily mean that the element is located "above" or "on" in a direction opposite to the gravity.

For example, spatially relative terms, such as "below", "on", and the like, may be used to describe the relationship between one element or constituent element and other constituent elements as shown in the drawings. Spatially relative terms may be intended to encompass different orientations of a device in use or operation, in addition to the orientation depicted in the drawings. For example, if devices in the drawings is turned over, a device that is positioned "below" another device may be positioned "on" the other device. Thus, for example, the term "below" may encompass both an orientation that is above, as well as, below. Since devices may be otherwise oriented, the spatially relative terms may be interpreted differently depending on their orientation.

When an element (or a region, a layer, a portion, and the like) is referred to as being "connected" or "coupled" to another element, the element may be directly on, may be directly connected and/or coupled to the other element, and/or intervening elements may be disposed therebetween.

The terms "connected to" or "coupled to" may encompass physical and/or electrical connections or coupling.

Unless otherwise defined, terms (including technical and scientific terms) used in the present disclosure may have the same meaning as commonly understood by those skilled in the art to which the embodiments pertain. It may be further understood that terms, such as those defined in commonly used dictionaries, may be interpreted as having a meaning that may be consistent with their meaning in the context of the relevant art and may not be interpreted in an idealized and/or overly formal sense unless expressly so defined herein.

Figure 2:
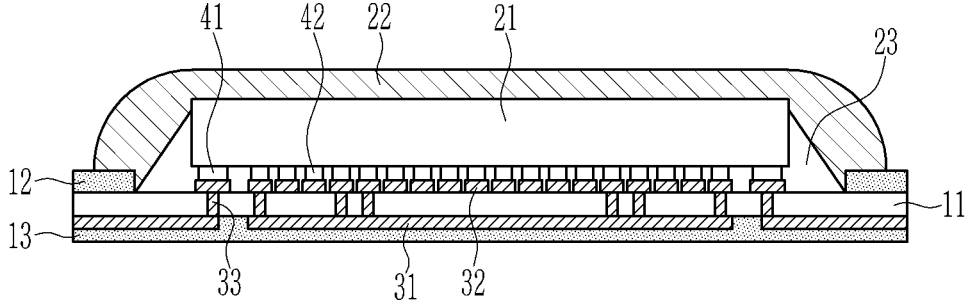
FIG. 2 is a cross-sectional view taken along line A-A' in FIG. 1, according to an embodiment.
Figure 3:
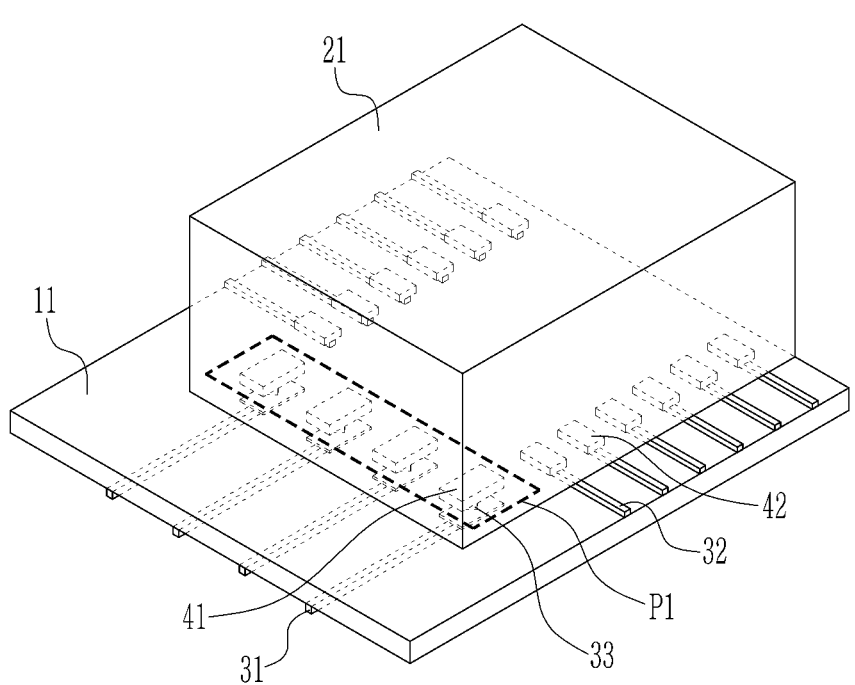
FIG. 3 is a partial perspective view illustrating the coupling between input/output terminals and wiring lines of a flexible insulating substrate in the semiconductor device shown in FIG. 1, according to an embodiment.

FIG. 1 is a top view of a semiconductor package, according to an embodiment. FIG. 2 is a cross-sectional view taken along line A-A' in FIG. 1, according to an embodiment. FIG. 3 is a partial perspective view illustrating the coupling between input/output terminals and wiring lines of a flexible insulating substrate in the semiconductor device shown in FIG. 1, according to an embodiment.

Referring to FIG. 1 and FIG. 2, an upper wiring 32 (e.g., a first wiring) may be positioned (disposed) on an upper surface (e.g., a first surface) of a flexible insulating substrate 11, and an upper solder resist 12 may be positioned so as to cover the upper wiring 32. Alternatively or additionally, lower wiring 31 (e.g. a second wiring) may be positioned on the lower surface (e.g., a second surface) of the flexible insulating substrate 11, and a lower solder resist 13 may be positioned so as to cover the lower wiring 31. The upper wiring 32 and the lower wiring 31 may be connected by vias 33 passing through the flexible insulating substrate 11. The flexible insulating substrate 11 may contain an insulating material having flexibility, such as, but not limited to, polyimide (PI). The upper and lower wirings 32 and 31 and the vias 33 may contain a conductive material such as, but not limited to, copper (Cu). The upper and lower solder resists 12 and 13 may contain an insulating material such as, but not limited to, a photosensitive material, a thermosetting resin mixture, and the like.

In an embodiment, semiconductor devices 21 may be positioned on the flexible insulating substrate 11. Alternatively or additionally, solder bumps (e.g., short-side-part solder bumps 41 and long-side-part solder bumps 42) may be positioned between the semiconductor devices 21 and the upper wiring 32. The solder bumps 41 and 42 may electrically couple the semiconductor devices 21 to the upper wiring 32. The semiconductor devices 21 may be and/or may include active devices such as, but not limited to, gate drivers, source drivers, and the like. The solder bumps 41 and 42 may contain a conductive material such as, but not limited to, gold (Au).

In an embodiments, underfill layers 23 may be positioned in spaces between the semiconductor devices 21 and the flexible insulating substrate 11. Alternatively or additionally, heat dissipation resin layers 22 may be positioned on the semiconductor devices 21. The underfill layer 23 may contain potting compounds such as, but not limited to, silicon (Si), polyurethane, epoxy resin, and the like. The heat dissipation resin layer 22 may contain a thermally conductive polymer compound that may be obtained by mixing a thermally conductive filler with at least one of an epoxy-based resin and a silicon-based thermosetting polymer.

Referring to FIG. 1, three (3) semiconductor device molds (e.g., first semiconductor device mold IC1, second semiconductor device mold IC2, and third semiconductor device mold IC3) may be positioned on the flexible insulating substrate 11. The heat dissipation resin layers 22 may be positioned so as to cover the semiconductor device molds IC1 to IC3.

In an embodiment, the heat dissipation resin layers 22 may be separated from one another. The thickness of the heat dissipation resin layers 22 may be about 1,000 micrometers (μm) to about 1,300 μm. The thickness range of the heat dissipation resin layers 22 may be determined based on the heat dissipation effect of the heat dissipation resin and/or the viscosity of the heat dissipation resin before thermal curing.

The long-side length of each heat dissipation resin layer 22 (Y direction in FIG. 1) may be about 20 millimeters (mm) to about 30 mm, and the short-side length of each heat dissipation resin layer 22 (X direction in FIG. 1) may be about 5 mm to about 6 mm. The range of the short-side and/or the long-side lengths may be determined based on the heat dissipation effect of the heat dissipation resin and/or the thermal stress that may be applied to the semiconductor devices 21.

In an embodiment, the first semiconductor device mold IC1 may be and/or may include a source driver, and the second and third semiconductor device molds IC2 and IC3 may be and/or may include gate drivers. However, the present disclosure is not limited in this regard, and the semiconductor device molds IC1 to IC3 may be the same and/or different devices from those described above without departing from the scope of the present disclosure.

Referring to FIG. 2 and FIG. 3, the plurality of solder bumps 41 and 42 may be positioned on the lower surfaces of the semiconductor devices 21, so as to be used as input/output terminals. The short-side-part solder bumps 41 may be positioned along the short-side parts of the semiconductor devices 21, and long-side-part solder bumps 42 may be positioned along the long-side parts of the semiconductor devices 21. The long-side-part solder bumps 42 may be directly coupled to the upper wiring 32. The short-side-part solder bumps 41 may be coupled to the lower wiring 31 through the vias 33. Some parts of the upper wiring 32 may be positioned as coupling pads of the vias 33 between the short-side-part solder bumps 41 and the vias 33.

In an embodiment, the short-side-part solder bumps 41 may be coupled to the lower wiring 31 through the vias 33, and as such, the short-side-part solder bumps 41 may also be used as input/output terminals of the semiconductor devices 21. Consequently, it may be possible to improve the degree of freedom in arranging the wiring of the flexible insulating substrate 11 and the semiconductor devices 21, and thereby, potentially increase package miniaturization.

Figure 4:
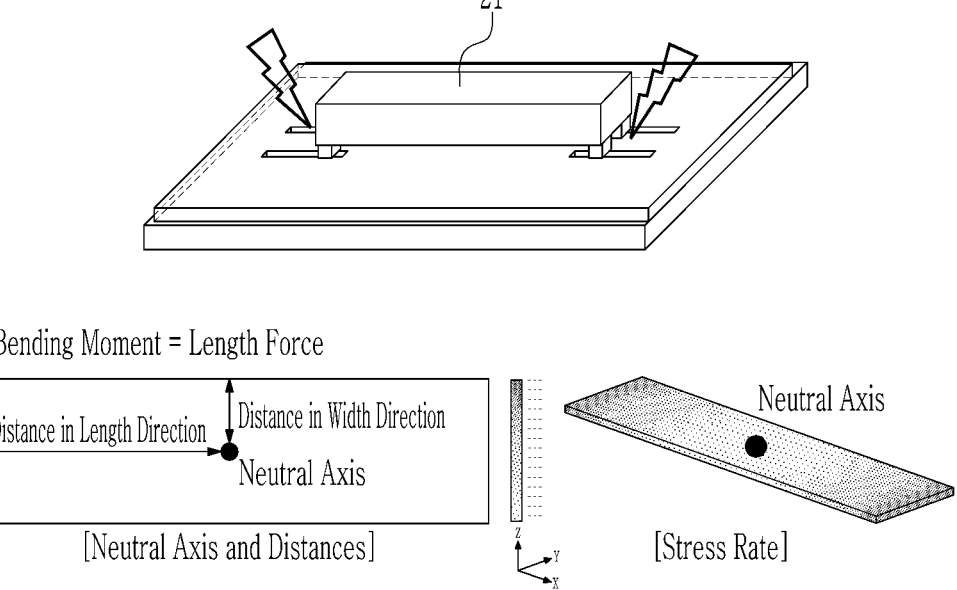
FIG. 4 is a conceptual view illustrating the degree of stress that may be applied to a semiconductor device covered with a heat dissipation resin during thermal expansion and contraction, according to an embodiment.

FIG. 4 is a conceptual view illustrating the degree of stress that may be applied to a semiconductor device covered with a heat dissipation resin during thermal expansion and contraction, according to an embodiment.

In an embodiment, when the semiconductor devices 21 are covered with the heat dissipation resin layers 22, thereby being fixed, heat that may be released from the semiconductor devices 21 may be efficiently released to the outside by the heat dissipation resin layers 22. Alternatively or additionally, the heat dissipation resin layers 22 may expand and/or contract in the process of releasing heat, which may affect the semiconductor devices 21.

Referring to FIG. 4, the thermal stress that may be applied to each semiconductor device 21 due to expansion and contraction of the heat dissipation resin layer 22 may mostly affect both short sides of the semiconductor device 21. Consequently, when the upper wiring 32 of the flexible insulating substrate 11 is disposed on the short-side parts of the semiconductor devices 21, thereby intersecting the short sides of the semiconductor devices 21, the upper wiring 32 of the corresponding parts may likely break and/or become damaged due to thermal stress. To that end, in the present disclosure, the vias 33 may be disposed directly below the short-side-part solder bumps 41 of the semiconductor devices 21, the short-side-part solder bumps 41 and the lower wiring 31 may be coupled through the vias 33, and the lower wiring 31 may be used as lead lines of the short-side-part solder bumps 41. Accordingly, the short-side-part solder bumps 41 may be used as input/output terminals.

Figure 5:
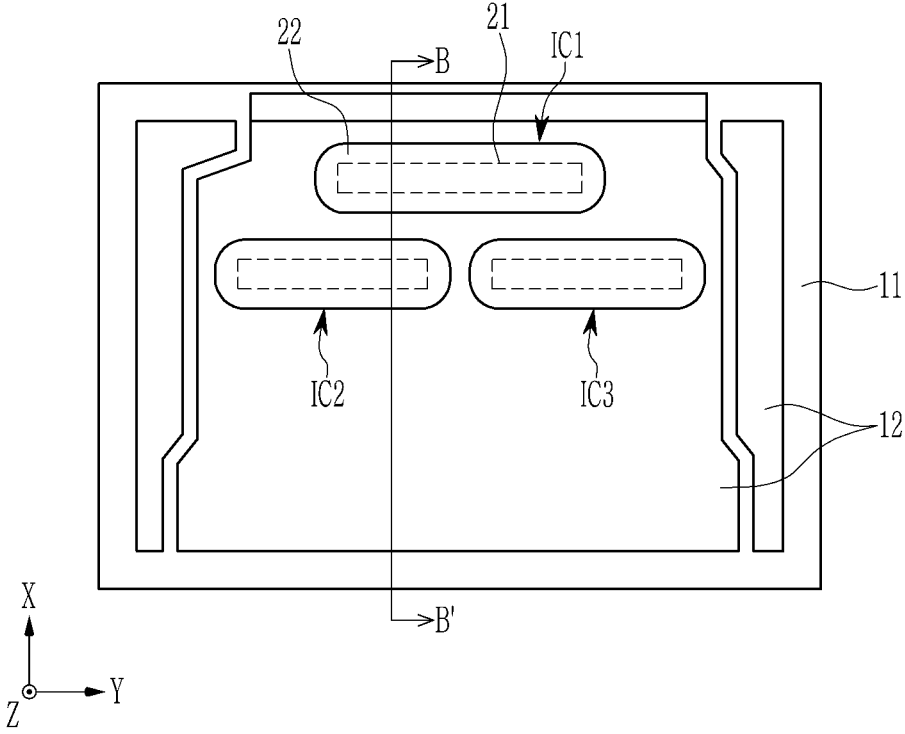
FIG. 5 is a top view of a semiconductor package, according to an embodiment.
Figure 6:
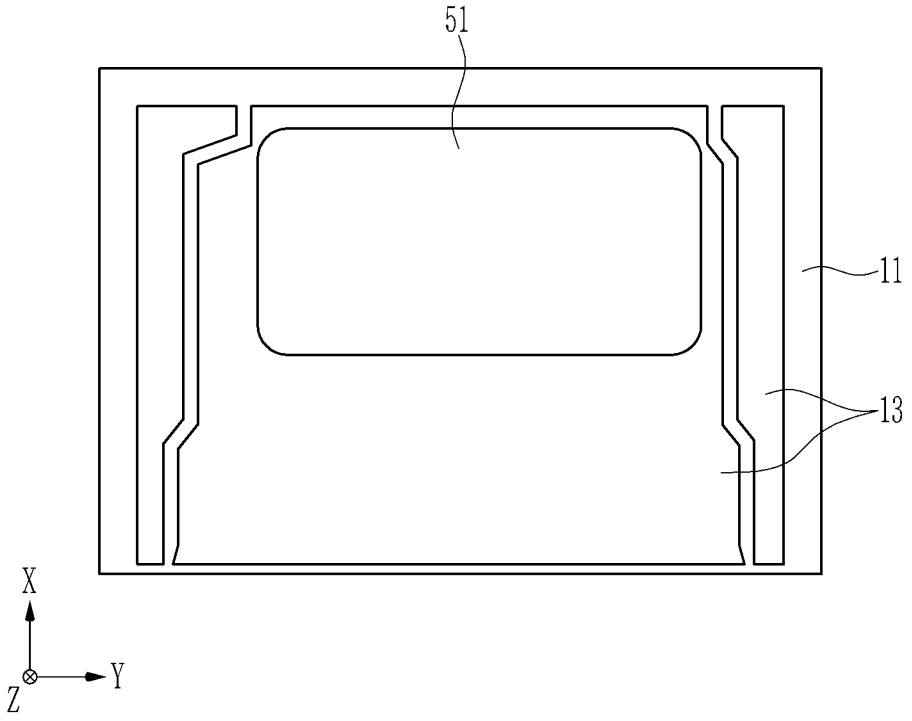
FIG. 6 is a bottom view of a semiconductor package, according to an embodiment.
Figure 7:
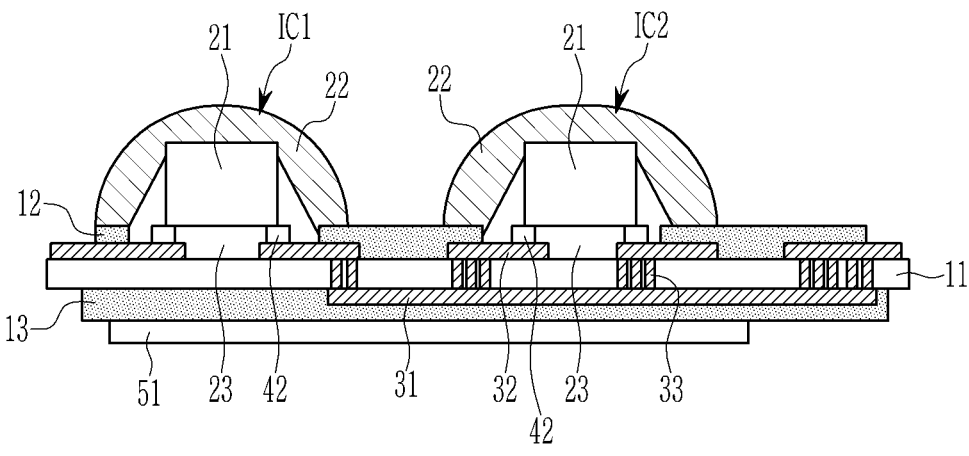
FIG. 7 is a cross-sectional view taken along line B-B' in FIG. 5, according to an embodiment.

FIG. 5 is a top view of a semiconductor package, according to an embodiment. FIG. 6 is a bottom view of a semiconductor package, according to an embodiment. FIG. 7 is a cross-sectional view taken along line B-B' in FIG. 5, according to an embodiment.

The semiconductor packages depicted in FIGS. 5 to 7 may include and/or may be similar in many respects to the semiconductor packages described above with reference to FIGS. 1 to 3, and may include additional features not mentioned above. Consequently, repeated descriptions of the semiconductor packages described above with reference to FIGS. 1 to 3 may be omitted for the sake of brevity.

For example, the semiconductor packages of FIGS. 5 to 7 may further include a lower heat dissipation layer 51 when compared to the semiconductor packages shown in FIGS. 1 to 3. The lower heat dissipation layer 51 may be positioned beneath the lower solder resist 13, and may be and/or include a tape containing a metal such as, but not limited to, aluminum (Al). The lower heat dissipation layer 51 may be attached to the lower solder resist 13 by an adhesive applied to an upper surface of the lower heat dissipation layer 51.

Consequently, the lower heat dissipation layer 51 may be disposed to potentially further improve the heat dissipation efficiency of the semiconductor package, when compared to related semiconductor packages.

Figure 8:
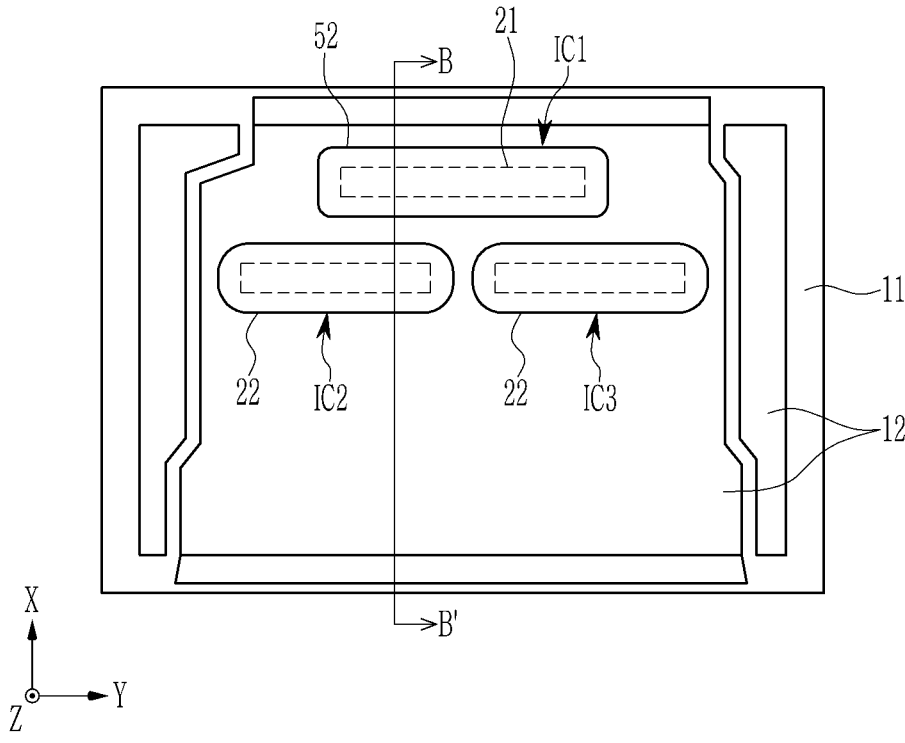
FIG. 8 is a top view of a semiconductor package, according to an embodiment.
Figure 9:
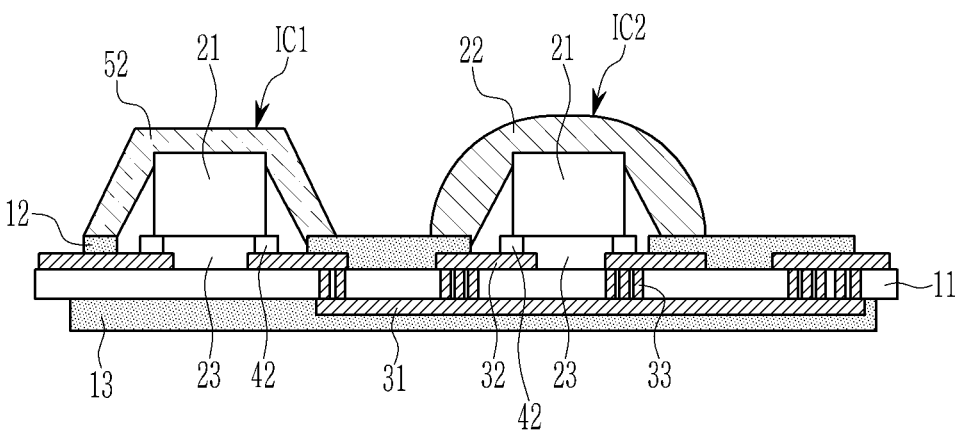
FIG. 9 is a cross-sectional view taken along line B-B' in FIG. 8, according to an embodiment.

FIG. 8 is a top view of a semiconductor package, according to an embodiment. FIG. 9 is a cross-sectional view taken along line B-B' in FIG. 8, according to an embodiment.

The semiconductor packages depicted in FIGS. 8 and 9 may include and/or may be similar in many respects to the semiconductor packages described above with reference to FIGS. 1 to 3, and may include additional features not mentioned above. Consequently, repeated descriptions of the semiconductor packages described above with reference to FIGS. 1 to 3 may be omitted for the sake of brevity.

For example, the semiconductor packages of FIGS. 8 and 9 may include heat dissipation tape 52 in place of the heat dissipation resin layer 22 of the first semiconductor device mold IC1. The heat dissipation tape 52 may be and/or may include a tape containing a metal such as, but not limited to, aluminum (Al). The heat dissipation tape 52 may be attached to the semiconductor device 21 and the upper solder resist 12 by an adhesive applied to the lower surface of the heat dissipation tape 52. In an embodiment, the first semiconductor device mold IC1 may be and/or may include a source driver. In such an embodiment, the source driver may generate more heat as compared to a gate driver. The heat dissipation tape 52 may have better heat dissipation performance when compared to a heat dissipation resin layers, and thus, may be applied to the first semiconductor device mold IC1 (e.g., a source driver). However, the present disclosure is not limited in this regard. For example, in some embodiments, the heat dissipation tape 52 may also be applied to the gate drivers (e.g., second and third semiconductor device molds IC2 and IC3).

Figure 10:
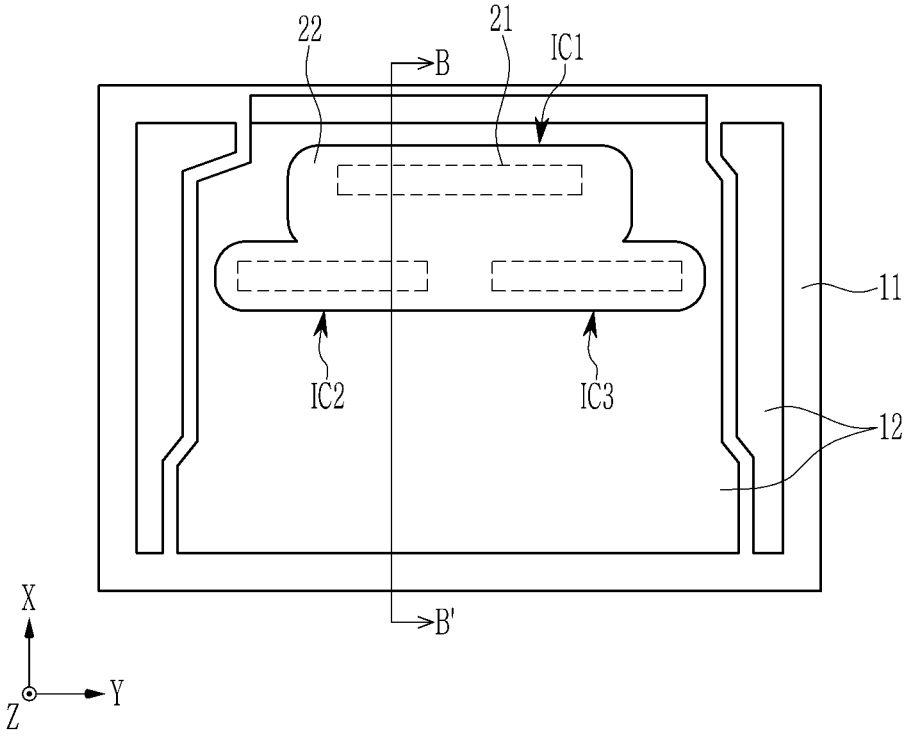
FIG. 10 is a top view of a semiconductor package, according to an embodiment.
Figure 11:
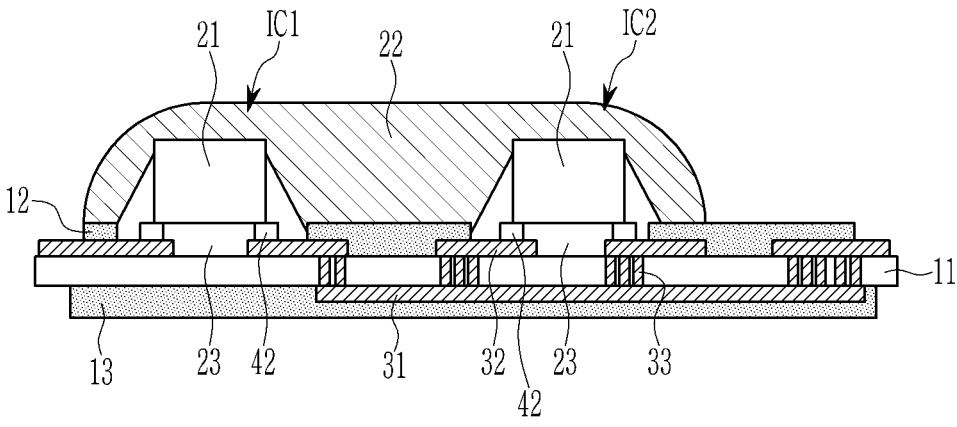
FIG. 11 is a cross-sectional view taken along line B-B' in FIG. 10, according to an embodiment.

FIG. 10 is a top view of a semiconductor package, according to an embodiment. FIG. 11 is a cross-sectional view taken along line B-B' in FIG. 10, according to an embodiment.

The semiconductor packages depicted in FIGS. 10 and 11 may include and/or may be similar in many respects to the semiconductor packages described above with reference to FIGS. 1 to 3, and may include additional features not mentioned above. Consequently, repeated descriptions of the semiconductor packages described above with reference to FIGS. 1 to 3 may be omitted for the sake of brevity.

For example, the semiconductor packages of FIGS. 10 and 11 may differ from the semiconductor packages shown in FIG. 1 to FIG. 3 in that the heat dissipation resin layers 22 of the first to third semiconductor device molds IC1, IC2, and IC3 may be integrally coupled. That is, the heat dissipation resin layers 22 may be integrally coupled to each other. When the heat dissipation resin layers 22 of the first to third semiconductor device molds IC1, IC2, and IC3 are integrated coupled, the usability of the upper surface of the semiconductor package may be improved. For example, a heat slug may be additionally attached to the semiconductor package to be used. However, the present disclosure is not limited in this regard. For example, in some embodiments, the heat dissipation resin layers 22 of two of the first to third semiconductor device molds IC1, IC2, and IC3 may be integrally coupled, and the other (remaining) heat dissipation resin layer may be disposed separately.

Although the embodiments have been described above with reference to the accompanying drawings, it may be understood by those skilled in the art to which the embodiments pertain that the embodiments may be implemented in other specific forms without changing the technical idea and/or the essential features of the present disclosure. Accordingly, it may be understood that the above-described embodiments are illustrative and non-restrictive in every respect.

What is claimed is:

1. A semiconductor package, comprising:
a flexible insulating substrate comprising a first surface and a second surface opposite to the first surface;
a first wiring on the first surface of the flexible insulating substrate;
a second wiring on the second surface of the flexible insulating substrate;
a plurality of vias coupling the first wiring to the second wiring;
a plurality of semiconductor devices on the first surface of the flexible insulating substrate; and
a heat dissipation resin layer at least partially covering at least one semiconductor device of the plurality of semiconductor devices.

2. The semiconductor package of claim 1, further comprising:
a plurality of solder bumps disposed between the plurality of semiconductor devices and the first wiring,
wherein the plurality of solder bumps comprises short-side-part solder bumps disposed along short sides of the plurality of semiconductor devices, and long-side-part solder bumps disposed along long sides of the plurality of semiconductor devices, and
wherein the short-side-part solder bumps are coupled to the second wiring using respective vias from among the plurality of vias, the respective vias being disposed directly below the short-side-part solder bumps.

3. The semiconductor package of claim 2, wherein the first wiring comprises a coupling pad disposed between each solder bump of the short-side-part solder bumps and the respective via.

4. The semiconductor package of claim 3, further comprising:
an underfill layer at least partially filling a space between the plurality of semiconductor devices and the flexible insulating substrate.

5. The semiconductor package of claim 4, further comprising:
a first solder resist configured to cover at least a first portion of the first wiring; and a second solder resist configured to cover at least a second portion of the second wiring.

6. The semiconductor package of claim 5, wherein the heat dissipation resin layer comprises a thermally conductive polymer compound comprising a thermally conductive filler and at least one of an epoxy-based resin and a silicon-based thermosetting polymer.

7. The semiconductor package of claim 5, wherein the underfill layer comprises potting compounds comprising at least one of silicon, polyurethane, and an epoxy resin.

8. The semiconductor package of claim 5, wherein the flexible insulating substrate comprises polyimide.

9. The semiconductor package of claim 1, further comprising:

a first solder resist configured to cover at least a first portion of the first wiring;

a second solder resist configured to cover at least a second portion of the second wiring; and a lower heat dissipation layer coupled to the second solder resist.

10. The semiconductor package of claim 9, wherein the lower heat dissipation layer comprises a metal tape.

11. The semiconductor package of claim 1, further comprising:

a heat dissipation tape configured to at least partially cover one or more semiconductor devices of the plurality of semiconductor devices.

12. The semiconductor package of claim 11, wherein the at least one semiconductor device at least partially covered by the heat dissipation resin layer is different from the one or more semiconductor devices at least partially covered by the heat dissipation tape.

13. The semiconductor package of claim 12, wherein the heat dissipation resin layer comprises a thermally conductive polymer compound comprising a thermally conductive filler and at least one of an epoxy-based resin and a silicon-based thermosetting polymer.

14. The semiconductor package of claim 13, wherein the heat dissipation tape comprises a metal tape.

15. The semiconductor package of claim 1, wherein the heat dissipation resin layer is separated into one or more portions, and wherein each portion of the one or more portions of the heat dissipation resin layer corresponds to a semiconductor device of the plurality of semiconductor devices.

16. The semiconductor package of claim 1, wherein the heat dissipation resin layer comprises an integrally coupled part at least partially covering at least two semiconductor devices of the plurality of semiconductor devices.

17. The semiconductor package of claim 16, wherein a portion of the heat dissipation resin layer at least partially covering the plurality of semiconductor devices is integrally coupled.

18. A semiconductor package, comprising:

a flexible insulating substrate comprising a first surface and a second surface opposite to the first surface;

a first wiring on the first surface of the flexible insulating substrate;

a second wiring on the second surface of the flexible insulating substrate;

a plurality of vias coupling the first wiring to the second wiring;

a plurality of semiconductor devices on the first surface of the flexible insulating substrate;

a plurality of solder bumps disposed between the plurality of semiconductor devices and the first wiring;

a first solder resist at least partially covering at least a first portion of the first wiring;

a second solder resist at least partially covering at least a second portion of the second wiring; and a heat dissipation resin layer at least partially covering the plurality of semiconductor devices, wherein the plurality of solder bumps comprises short-side-part solder bumps disposed along short sides of the plurality of semiconductor devices, and long-side-part solder bumps disposed along long sides of the plurality of semiconductor devices, wherein the short-side-part solder bumps are coupled to the second wiring using respective vias from among the plurality of vias, the respective vias being disposed directly below the short-side-part solder bumps, and wherein the heat dissipation resin layer comprises a thermally conductive polymer compound comprising a thermally conductive filler and at least one of an epoxy-based resin and a silicon-based thermosetting polymer.

19. The semiconductor package of claim 18, further comprising:

a metal tape coupled to the second solder resist.

20. A semiconductor package, comprising:

a flexible insulating substrate comprising a first surface and a second surface opposite to the first surface;

a first wiring on the first surface of the flexible insulating substrate;

a second wiring on the second surface of the flexible insulating substrate;

a plurality of vias coupling the first wiring to the second wiring;

a plurality of semiconductor devices on the first surface of the flexible insulating substrate;

a plurality of solder bumps disposed between the plurality of semiconductor devices and the first wiring;

a first solder resist at least partially covering at least a first portion of the first wiring;

a second solder resist at least partially covering at least a second portion of the second wiring;

a heat dissipation resin layer at least partially covering at least one semiconductor devices of the plurality of semiconductor devices; and a metal tape at least partially covering remaining semiconductor devices of the plurality of semiconductor devices, wherein the plurality of solder bumps comprises short-side-part solder bumps disposed along short sides of the plurality of semiconductor devices, and long-side-part solder bumps disposed along long sides of the plurality of semiconductor devices, wherein the short-side-part solder bumps are coupled to the second wiring using respective vias from among the plurality of vias, the respective vias being disposed directly below the short-side-part solder bumps, and wherein the heat dissipation resin layer comprises a thermally conductive polymer compound comprising a thermally conductive filler and at least one of an epoxy-based resin and a silicon-based thermosetting polymer.

* * * * *